US012300497B2

(12) United States Patent
Chua et al.

(10) Patent No.: US 12,300,497 B2
(45) Date of Patent: May 13, 2025

(54) METHOD AND APPARATUS OF LOW TEMPERATURE PLASMA ENHANCED CHEMICAL VAPOR DEPOSITION OF GRAPHENE

(71) Applicant: Applied Materials, Inc., Santa Clara, CA (US)

(72) Inventors: Thai Cheng Chua, Cupertino, CA (US); Christian Valencia, Alhambra, CA (US); Chikuang Wang, Santa Clara, CA (US); Bencherki Mebarki, Santa Clara, CA (US); Hanh Nguyen, San Jose, CA (US); Philip Allan Kraus, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 231 days.

(21) Appl. No.: 17/174,224

(22) Filed: Feb. 11, 2021

(65) Prior Publication Data
US 2022/0254641 A1    Aug. 11, 2022

(51) Int. Cl.
C23C 16/00 (2006.01)
C23C 16/02 (2006.01)
(Continued)

(52) U.S. Cl.
CPC .... H01L 21/28556 (2013.01); C23C 16/0254 (2013.01); C23C 16/26 (2013.01);
(Continued)

(58) Field of Classification Search
CPC ................ C23C 16/00; H01L 21/00
See application file for complete search history.

(56) References Cited

U.S. PATENT DOCUMENTS

2010/0065214 A1    3/2010  Kennedy et al.
2010/0240214 A1*   9/2010  Chiu ............... H01L 21/76856
                                              257/E21.295
(Continued)

FOREIGN PATENT DOCUMENTS

JP    2004-524677       8/2004
JP    2015510489 A      4/2015
(Continued)

OTHER PUBLICATIONS

"Synthesis of few-layer graphene via microwave plasma-enhanced chemical vapour deposition", Alexander Malesevic, Roumen Vitchev, Koen Schouteden, Nanotechnology 19, 305604, (Year: 2008).*
(Continued)

Primary Examiner — Kelly M Gambetta
Assistant Examiner — Mohammad Mayy
(74) Attorney, Agent, or Firm — Schwabe, Williamson & Wyatt, P.C.

(57) ABSTRACT

Embodiments disclosed herein include methods and apparatuses used to deposit graphene layers. In an embodiment, a method of depositing a graphene layer on a substrate comprises providing a substrate within a modular microwave plasma chamber, and flowing a carbon source and a hydrogen source into the modular microwave plasma chamber. In an embodiment, the method further comprises striking a plasma in the modular microwave plasma chamber, where a substrate temperature is below approximately 400° C., and depositing the graphene layer on the substrate.

15 Claims, 9 Drawing Sheets

(51) Int. Cl.
- *C23C 16/26* (2006.01)
- *C23C 16/511* (2006.01)
- *H01J 37/32* (2006.01)
- *H01L 21/285* (2006.01)

(52) U.S. Cl.
CPC ...... *C23C 16/511* (2013.01); *H01J 37/32192* (2013.01); *H01J 37/3244* (2013.01); *H01J 2237/3321* (2013.01)

(56) References Cited

U.S. PATENT DOCUMENTS

| | | | |
|---|---|---|---|
| 2011/0303899 | A1 | 12/2011 | Padhi et al. |
| 2013/0341185 | A1* | 12/2013 | Collaert ............. G01N 33/4836 438/49 |
| 2014/0044885 | A1* | 2/2014 | Boyd ................ H01J 37/32449 118/697 |
| 2014/0145332 | A1 | 5/2014 | Ryan et al. |
| 2014/0287155 | A1* | 9/2014 | Matsumoto ............ B01J 23/462 427/535 |
| 2015/0368111 | A1 | 12/2015 | Boyd |
| 2017/0044018 | A1* | 2/2017 | Boyd ................ H01L 21/02527 |
| 2017/0200587 | A1* | 7/2017 | Godet ................ H01L 21/3065 |
| 2018/0158677 | A1 | 6/2018 | Beasley et al. |
| 2018/0294143 | A1* | 10/2018 | Chua ................... H01J 37/3299 |
| 2018/0323043 | A1 | 11/2018 | Kraus et al. |
| 2019/0010604 | A1* | 1/2019 | Boyd ................... B01J 23/462 427/535 |
| 2019/0345609 | A1 | 11/2019 | Chen et al. |
| 2020/0051920 | A1 | 2/2020 | Wu et al. |
| 2020/0105525 | A1 | 4/2020 | Zhou et al. |
| 2020/0325574 | A1 | 10/2020 | Tseng et al. |

FOREIGN PATENT DOCUMENTS

| | | |
|---|---|---|
| JP | 2017014086 A | 1/2017 |
| JP | 2020520536 A | 7/2020 |
| KR | 10-1246191 | 3/2013 |
| KR | 1020140093939 | 7/2014 |
| KR | 1020180094109 | 8/2018 |
| WO | WO 2004/032176 | 4/2004 |

OTHER PUBLICATIONS

"Removal of Titanium Oxide Grown on Titanium Nitride and Reduction of VIA Contact Resistance using a Modern Plasma Asher", Mohamed Boumerzoug, Han Xu, Richard Bersin, Mat. Res. Soc. Symp. Proc. vol. 495, Materials Research Society, (Year: 1998).*

International Search Report and Written Opinion from Patent Application No. PCT/US2022/012020 dated May 2, 2022, 11 pgs.

International Preliminary Report on Patentability from PCT/US2022/012020 dated Aug. 24, 2023, 8 pgs.

Official Letter from Taiwan Patent Application No. 111102133 dated Mar. 18, 2024, 5 pgs.

Extended European Search Report for Application No. EP 22753102.7 dated Jun. 5, 2024, 8 pgs.

Yamada, et al, "Low-temperature graphene synthesis using microwave plasma CVD," Journal of Physics D; Appl. Phys. 46 (2013), 8 pp.

Notice of Preliminary Rejection for Korean Patent Application No. 10-2023-7030247, dated Dec. 17, 2024, 9 pgs.

Notice of Reasons for Rejection from Japanese Patent Application No. 2023-548270 dated Oct. 22, 2024, 7 pgs.

Yamada, et al. "Low-temperature graphene synthesis using microwave plasma CVD," J. Phys. D: Appl. Phys. 46 (2013) 063001, 9 pgs.

* cited by examiner

METHOD AND APPARATUS OF LOW TEMPERATURE PLASMA ENHANCED CHEMICAL VAPOR DEPOSITION OF GRAPHENE

BACKGROUND

1) Field

Embodiments relate to the field of semiconductor manufacturing and, in particular, to modular microwave plasma sources used in the plasma enhanced chemical vapor deposition of graphene at low temperatures.

2) Description of Related Art

Graphene is an atomic-scale hexagonal lattice made of carbon atoms. Graphene has exceptional electrical and mechanical properties and has been the interest of many research and development efforts. Typically, graphene is formed using one of two general processes. A first method is the use of an exfoliation process, and a second method is the use of thermal chemical vapor deposition (CVD) process. The use of thermal CVD is a promising method to form graphene due to its ability to form graphene in a high volume manufacturing (HVM) environment.

However, thermal CVD processes are typically implemented at high temperatures (e.g., in excess of 1,000° C.). As such, graphene formed in this manner is generally not suitable for microelectronic applications due to the low thermal budgets of such devices. Accordingly, it is exceedingly difficult to harness the electrical properties provided by graphene in advanced semiconductor devices.

SUMMARY

Embodiments disclosed herein include methods and apparatuses used to deposit graphene layers. In an embodiment, a method of depositing a graphene layer on a substrate comprises providing a substrate within a modular microwave plasma chamber, and flowing a carbon source and a hydrogen source into the modular microwave plasma chamber. In an embodiment, the method further comprises striking a plasma in the modular microwave plasma chamber, where a substrate temperature is below approximately 400° C., and depositing the graphene layer on the substrate.

Embodiments disclosed herein further comprise a method of depositing a graphene layer on a substrate that comprises providing a substrate in a modular microwave plasma chamber. In an embodiment, the modular microwave plasma chamber comprises a chamber, a dielectric chamber lid, a plurality of microwave applicators coupled to the dielectric chamber lid, where the plurality of microwave applicators sit in recesses into the dielectric chamber lid, and a plurality of solid state microwave emission modules. In an embodiment, each solid state microwave emission module is coupled to one of the plurality of microwave applicators. In an embodiment, the method further comprises flowing a carbon source and a hydrogen source into the modular microwave plasma chamber, and striking a plasma in the modular microwave plasma chamber by applying microwave power to a plurality of antennae that are laterally separated from each other. In an embodiment, a substrate temperature is below approximately 400° C. In an embodiment, the method further comprises depositing the graphene layer on the substrate.

Additional embodiments disclosed herein include a method of depositing a graphene layer on a substrate comprising, providing a substrate within a modular microwave plasma chamber, and treating a surface of the substrate with a first plasma process. In an embodiment, the method further comprises initiating a second plasma process that comprises flowing a carbon source and a hydrogen source into the modular microwave plasma chamber, and striking a plasma in the modular microwave plasma chamber. In an embodiment, a substrate temperature is below approximately 400° C. In an embodiment, the method further comprises depositing the graphene layer on the substrate, where a laser Raman spectrum of the graphene layer comprises an $I_D/I_G$ ratio that is approximately 1.0 or smaller, and where the laser Raman spectrum of the graphene layer comprises an $I_{2D}/I_G$ ratio that is approximately 1.0 or greater.

DETAILED DESCRIPTION

Systems described herein include modular microwave plasma sources used in the plasma enhanced chemical vapor deposition of graphene at low temperatures. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

Figure 1A:
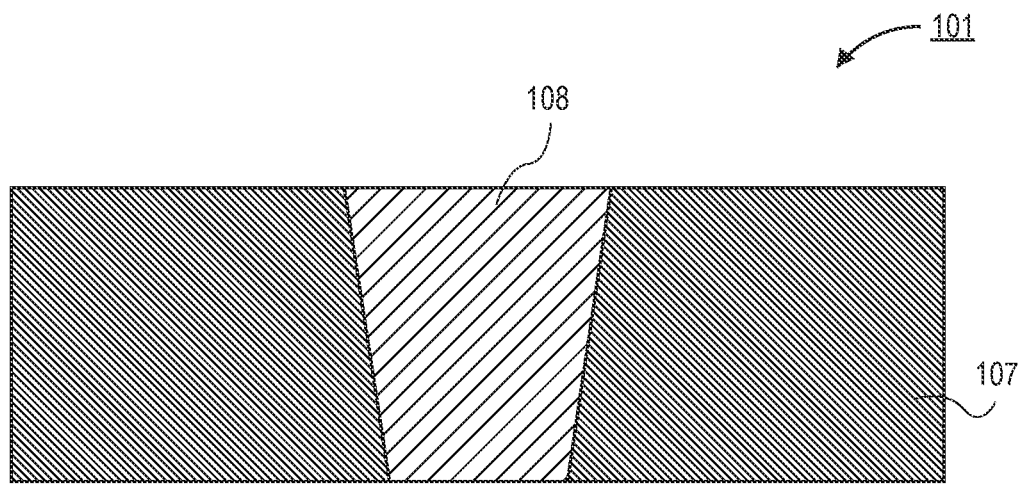
FIG. 1A is a cross-sectional illustration of a conductive interconnect in a semiconductor device, in accordance with an embodiment.
Figure 1B:
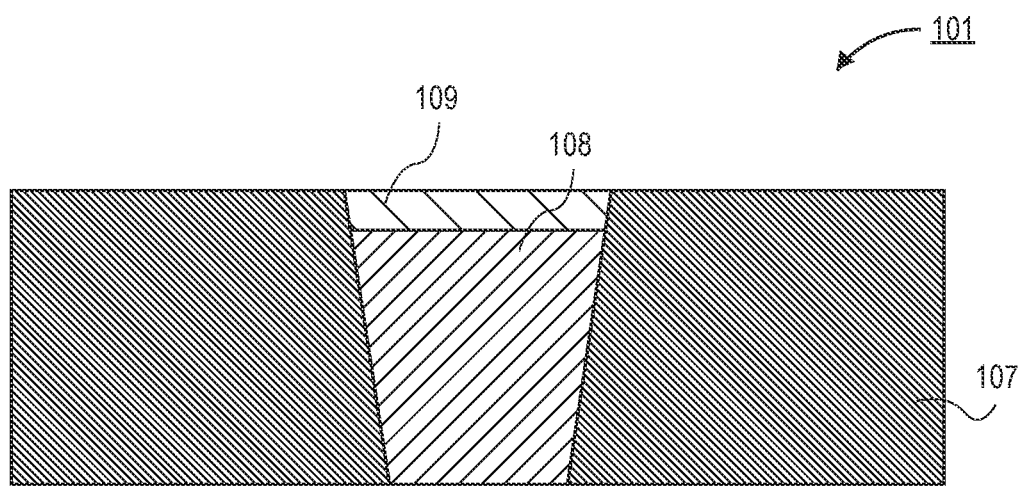
FIG. 1B is a cross-sectional illustration of a conductive interconnect with a graphene layer over the top of the conductive interconnect, in a semiconductor device, in accordance with an embodiment.

As noted above, the electrical properties of graphene layers make graphene a great candidate for various uses in semiconductor manufacturing processes. Particularly, graphene layers over conductive materials have shown a decrease in the contact resistance. For example, in FIG. 1A, a semiconductor device 101 with an interconnect 108 in a dielectric layer 107 is shown. The interconnect 108 may be a trace and/or via that is used to provide an electrical connection to one or more transistor devices (not shown in FIG. 1A). In an embodiment, the contact resistance of the interconnect 108 is fixed by material properties. In order to reduce contact resistance (and improve performance of the semiconductor device 101), a graphene layer 109 may be disposed over the interconnect 108, as shown in FIG. 1B. It has been shown that providing a graphene layer 109 over copper provides an approximately 15% reduction in the contact resistance.

However, due to the high temperatures needed for depositing the graphene, it has not been possible to integrate graphene into most process flows for advanced semiconductor devices. High temperatures are needed due to the growth mechanism of the graphene. Without being tied to a particular mechanism, it is believed that carbon diffuses into the surface of the metal and precipitates out of the metal to form the graphene. Due to the diffusion and precipitation processes, high temperatures are necessary.

In contrast, embodiments disclosed herein utilize a plasma enhanced chemical vapor deposition (PE-CVD) process in order to form the graphene over conductive materials. Particularly, embodiments disclosed herein include a modular microwave plasma source in order to generate the plasma. The use of a modular microwave plasma source allows for a denser plasma with more reactive species. Such processing tools allow for an increase in the concentration of atomic hydrogen in the plasma. Without being tied to a particular mechanism, it is believed that increases in atomic hydrogen promote surface mobilities to allow for surface diffusion and generation of the graphene, even at low temperatures. In some embodiments, the temperature may be approximately 400° C. or lower, or approximately 300° C. or lower. The low temperature processes enable graphene formation even with the strict thermal budgets of advanced semiconductor devices.

Figure 2A:
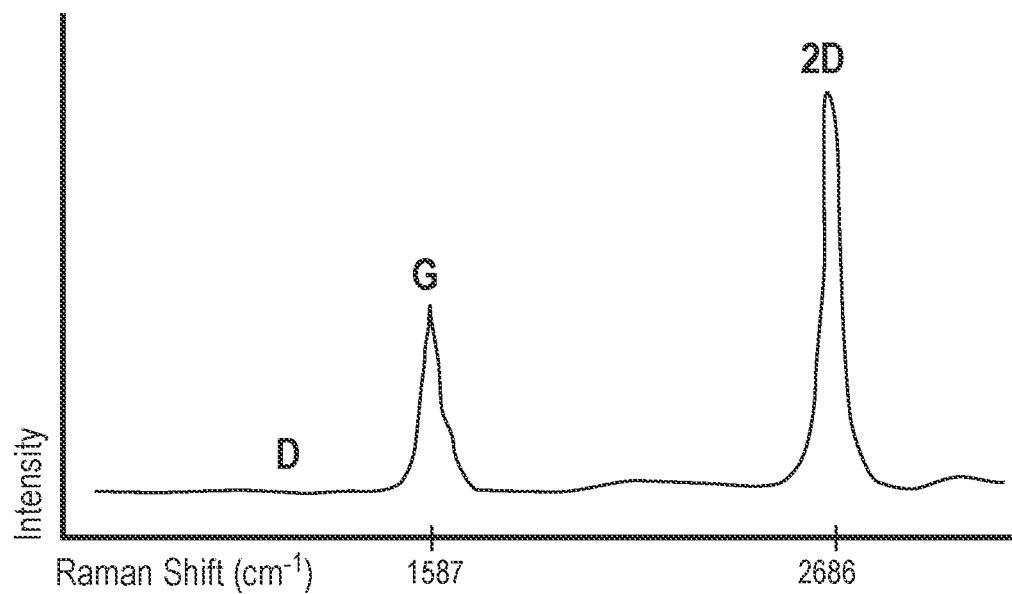
FIG. 2A is a Raman shift graph of an ideal graphene layer, in accordance with an embodiment.

The quality of graphene (e.g., defect density, etc.) may be measured by analyzing a Raman shift plot. An example of Raman shift plot for an ideal graphene layer is shown in FIG. 2A. As shown, a G peak and a 2D peak are provided. The 2D peak indicates the presence of graphene. If the 2D peak was absent or had a reduced intensity with a larger full width at half maximum (FWHM), the material being analyzed would be graphite or carbon black. Additionally, the location where the D peak would be located is shown in FIG. 2A. In the ideal graphene the D peak is zero. As defects increase in the graphene the D peak grows in intensity. Ratios between the peaks can be used as a metric to determine the graphene quality. For example, the intensity of the D peak over the intensity of the G peak ($I_D/I_G$) is desired to be close to 0. Additionally, the intensity of the 2D peak over the G peak ($I_{2D}/I_G$) should be close to 2. However, ratios of $I_{2D}/I_G$ that are close to 1 still indicate a high quality graphene layer.

Figure 2B:
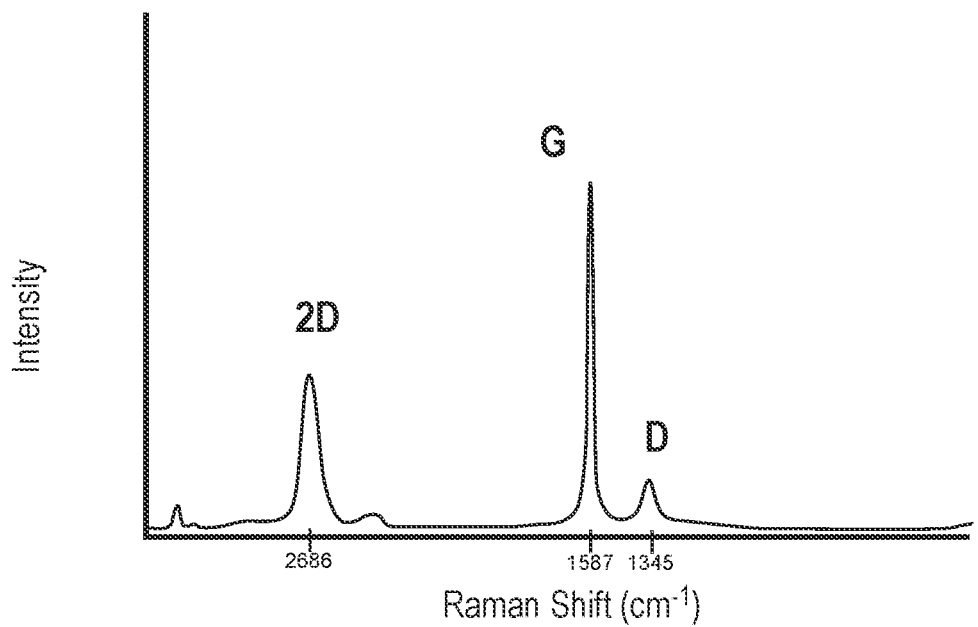
FIG. 2B is a Raman shift graph of a graphene layer with an acceptable degree of defects, in accordance with an embodiment.

An example of a non-ideal, but still suitable, graphene layer is shown in FIG. 2B. The Raman shift axis is mirrored of that in FIG. 2A. That is, in FIG. 2A, the G peak is to the left of the 2D peak in FIG. 2A, and the G peak is to the right of the 2D peak in FIG. 2B. As shown, there is a small D peak in FIG. 2B. This indicates that there is some degree of defects in the graphene. Additionally, the $I_{2D}/I_G$ ratio is not as ideal as what is shown in FIG. 2A. However, a strong signal is shown in the 2D peak indicating the presence of graphene.

Referring now to FIGS. 3A-3D, a series of illustrations depicting a modular microwave processing tool 300 is shown, in accordance with an embodiment. The modular microwave plasma processing tool 300 generates high plasma densities that are necessary for low temperature graphene deposition. That is, other types of plasma sources may not be able to generate low temperature graphene.

Figure 3A:
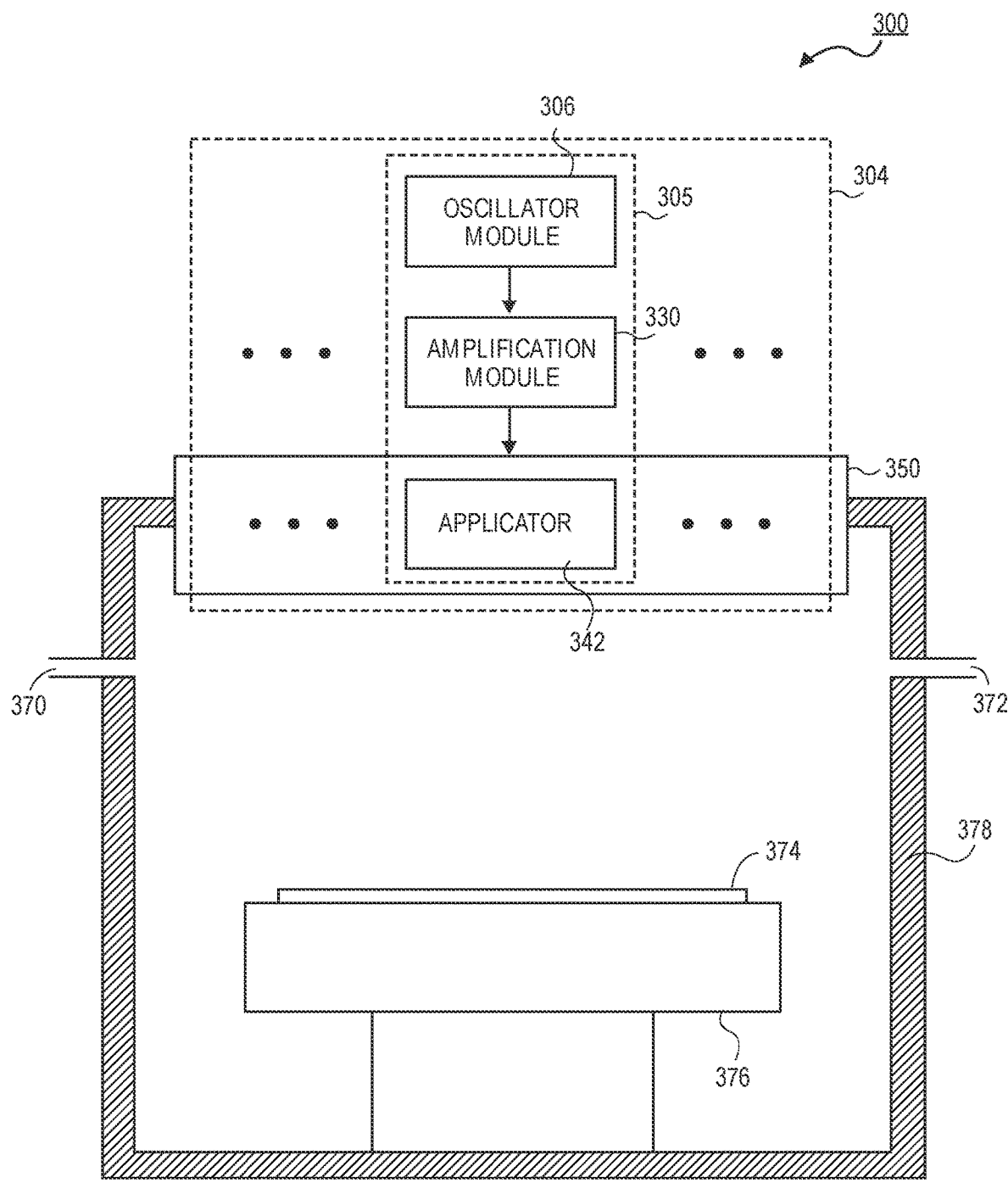
FIG. 3A is a schematic of a semiconductor processing tool with a modular microwave plasma source, in accordance with an embodiment.

Referring now to FIG. 3A, a cross-sectional illustration of a modular microwave plasma processing tool 300 (referred to as processing tool 300 for short) is shown, according to an embodiment. In some embodiments, the processing tool 300 may be a processing tool suitable for any type of processing operation that utilizes a plasma. For example, the processing tool 300 may be a processing tool used for plasma enhanced chemical vapor deposition (PE-CVD). The processing tool may emit high-frequency electromagnetic radiation. As used herein, "high-frequency" electromagnetic radiation includes radio frequency radiation, very-high-frequency radiation, ultra-high-frequency radiation, and microwave radiation. "High-frequency" may refer to frequencies between 0.1 MHz and 300 GHz.

Generally, embodiments include a processing tool 300 that includes a chamber 378. In processing tool 300, the chamber 378 may be a vacuum chamber. A vacuum chamber may include a pump (not shown) for removing gases from the chamber to provide the desired vacuum. Additional embodiments may include a chamber 378 that includes one or more gas lines 370 for providing processing gasses into the chamber 378 and exhaust lines 372 for removing byproducts from the chamber 378. While not shown, it is to be appreciated that gas may also be injected into the chamber 378 through a source array 350 (e.g., as a showerhead) for evenly distributing the processing gases over a substrate 374.

In an embodiment, the substrate 374 may be supported on a chuck 376. For example, the chuck 376 may be any suitable chuck, such as an electrostatic chuck. The chuck 376 may also include cooling lines and/or a heater to provide temperature control to the substrate 374 during processing. Due to the modular configuration of the high-frequency emission modules described herein, embodiments allow for the processing tool 300 to accommodate any sized substrate 374. For example, the substrate 374 may be a semiconductor wafer (e.g., 200 mm, 300 mm, 450 mm, or larger). Alternative embodiments also include substrates 374 other than semiconductor wafers. For example, embodiments may include a processing tool 300 configured for processing glass substrates, (e.g., for display technologies).

According to an embodiment, the processing tool 300 includes a modular high-frequency emission source 304. The modular high-frequency emission source 304 may comprise an array of high-frequency emission modules 305. In an embodiment, each high-frequency emission module 305 may include an oscillator module 306, an amplification module 330, and an applicator 342. As shown, the applicators 342 are schematically shown as being integrated into the source array 350.

In an embodiment, the oscillator module 306 and the amplification module 330 may comprise electrical components that are solid state electrical components. In an embodiment, each of the plurality of oscillator modules 306 may be communicatively coupled to different amplification modules 330. For example, each oscillator module 306 may be electrically coupled to a single amplification module 330.

In an embodiment, the plurality of oscillator modules 306 may generate incoherent electromagnetic radiation. Accordingly, the electromagnetic radiation induced in the chamber 378 will not interact in a manner that results in an undesirable interference pattern.

In an embodiment, each oscillator module 306 generates high-frequency electromagnetic radiation that is transmitted to the amplification module 330. After processing by the amplification module 330, the electromagnetic radiation is transmitted to the applicator 342. In an embodiment, the applicators 342 each emit electromagnetic radiation into the chamber 378. In some embodiments, the applicators 342 couple the electromagnetic radiation to the processing gasses in the chamber 378 to produce a plasma.

Figure 3B:
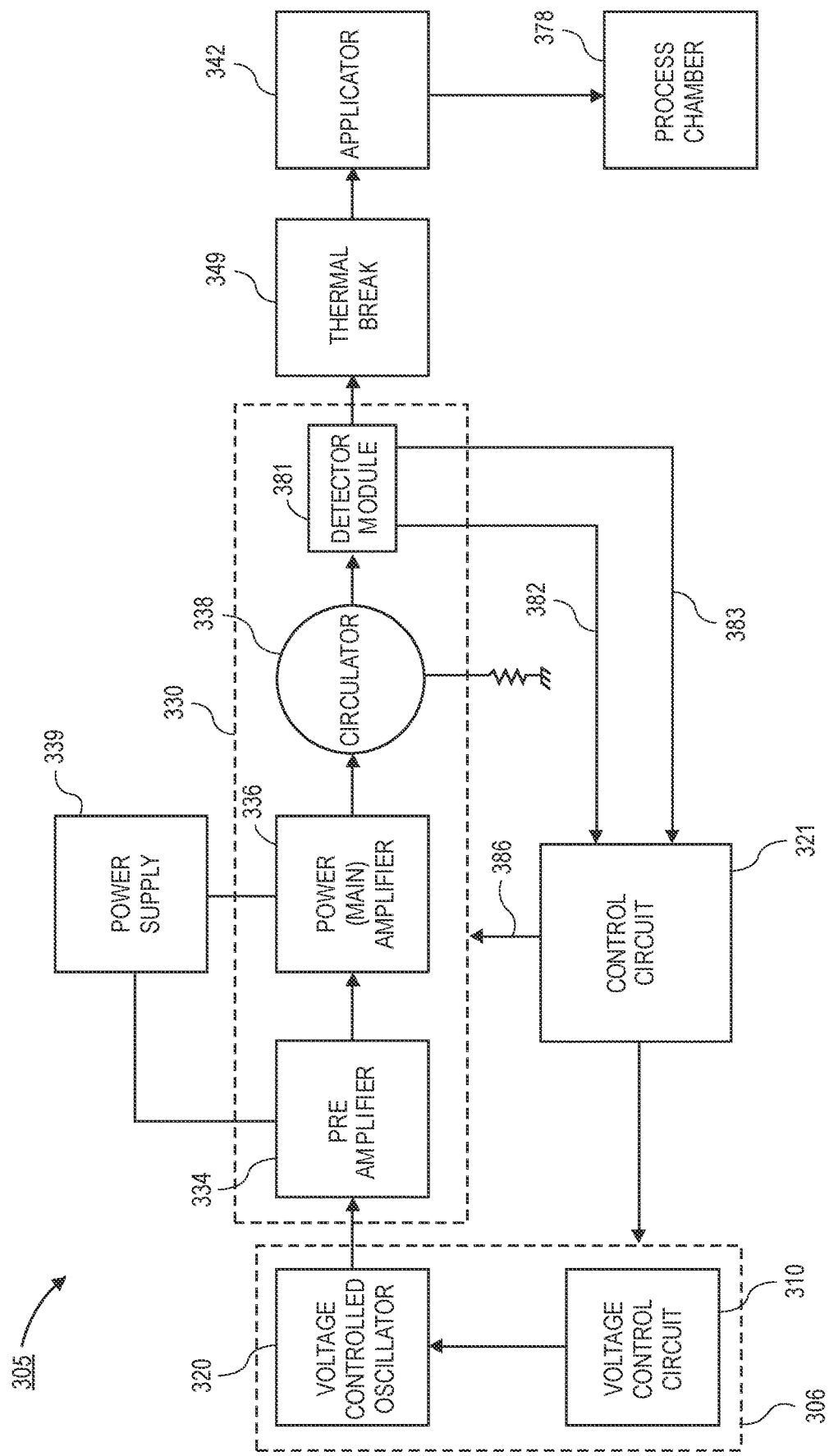
FIG. 3B is a schematic of a solid state microwave emission module, in accordance with an embodiment.

Referring now to FIG. 3B, a schematic of a solid state high-frequency emission module 305 is shown, in accordance with an embodiment. In an embodiment, the high-frequency emission module 305 comprises an oscillator module 306. The oscillator module 306 may include a voltage control circuit 310 for providing an input voltage to a voltage controlled oscillator 320 in order to produce high-frequency electromagnetic radiation at a desired frequency. Embodiments may include an input voltage between approximately 1V and 30V DC. The voltage controlled oscillator 320 is an electronic oscillator whose oscillation frequency is controlled by the input voltage. According to an embodiment, the input voltage from the voltage control circuit 310 results in the voltage controlled oscillator 320 oscillating at a desired frequency. In an embodiment, the high-frequency electromagnetic radiation may have a frequency between approximately 0.1 MHz and 30 MHz. In an embodiment, the high-frequency electromagnetic radiation may have a frequency between approximately 30 MHz and 300 MHz. In an embodiment, the high-frequency electromagnetic radiation may have a frequency between approximately 300 MHz and 1 GHz. In an embodiment, the high-frequency electromagnetic radiation may have a frequency between approximately 1 GHz and 300 GHz.

According to an embodiment, the electromagnetic radiation is transmitted from the voltage controlled oscillator 320 to an amplification module 330. The amplification module 330 may include a driver/pre-amplifier 334, and a main power amplifier 336 that are each coupled to a power supply 339. According to an embodiment, the amplification module 330 may operate in a pulse mode. For example, the amplification module 330 may have a duty cycle between 1% and 99%. In a more particular embodiment, the amplification module 330 may have a duty cycle between approximately 15% and 50%.

In an embodiment, the electromagnetic radiation may be transmitted to the thermal break 349 and the applicator 342 after being processed by the amplification module 330. However, part of the power transmitted to the thermal break 349 may be reflected back due to the mismatch in the output impedance. Accordingly, some embodiments include a detector module 381 that allows for the level of forward power 383 and reflected power 382 to be sensed and fed back to the control circuit module 321. It is to be appreciated that the detector module 381 may be located at one or more different locations in the system (e.g., between the circulator 338 and the thermal break 349). In an embodiment, the control circuit module 321 interprets the forward power 383 and the reflected power 382, and determines the level for the control signal 385 that is communicatively coupled to the oscillator module 306 and the level for the control signal 386 that is communicatively coupled to the amplification module 330. In an embodiment, control signal 385 adjusts the oscillator module 306 to optimize the high-frequency radiation coupled to the amplification module 330. In an embodiment, control signal 386 adjusts the amplification module 330 to optimize the output power coupled to the applicator 342 through the thermal break 349. In an embodiment, the feedback control of the oscillator module 306 and the amplification module 330, in addition to the tailoring of the impedance matching in the thermal break 349, may allow for the level of the reflected power to be less than approximately 5% of the forward power. In some embodiments, the feedback control of the oscillator module 306 and the amplification module 330 may allow for the level of the reflected power to be less than approximately 2% of the forward power.

Accordingly, embodiments allow for an increased percentage of the forward power to be coupled into the processing chamber 378, and increases the available power coupled to the plasma. Furthermore, impedance tuning using a feedback control is superior to impedance tuning in typical slot-plate antennas. In slot-plate antennas, the impedance tuning involves moving two dielectric slugs formed in the applicator. This involves mechanical motion of two separate components in the applicator, which increases the complexity of the applicator. Furthermore, the mechanical motion may not be as precise as the change in frequency that may be provided by a voltage controlled oscillator 320.

Figure 3C:
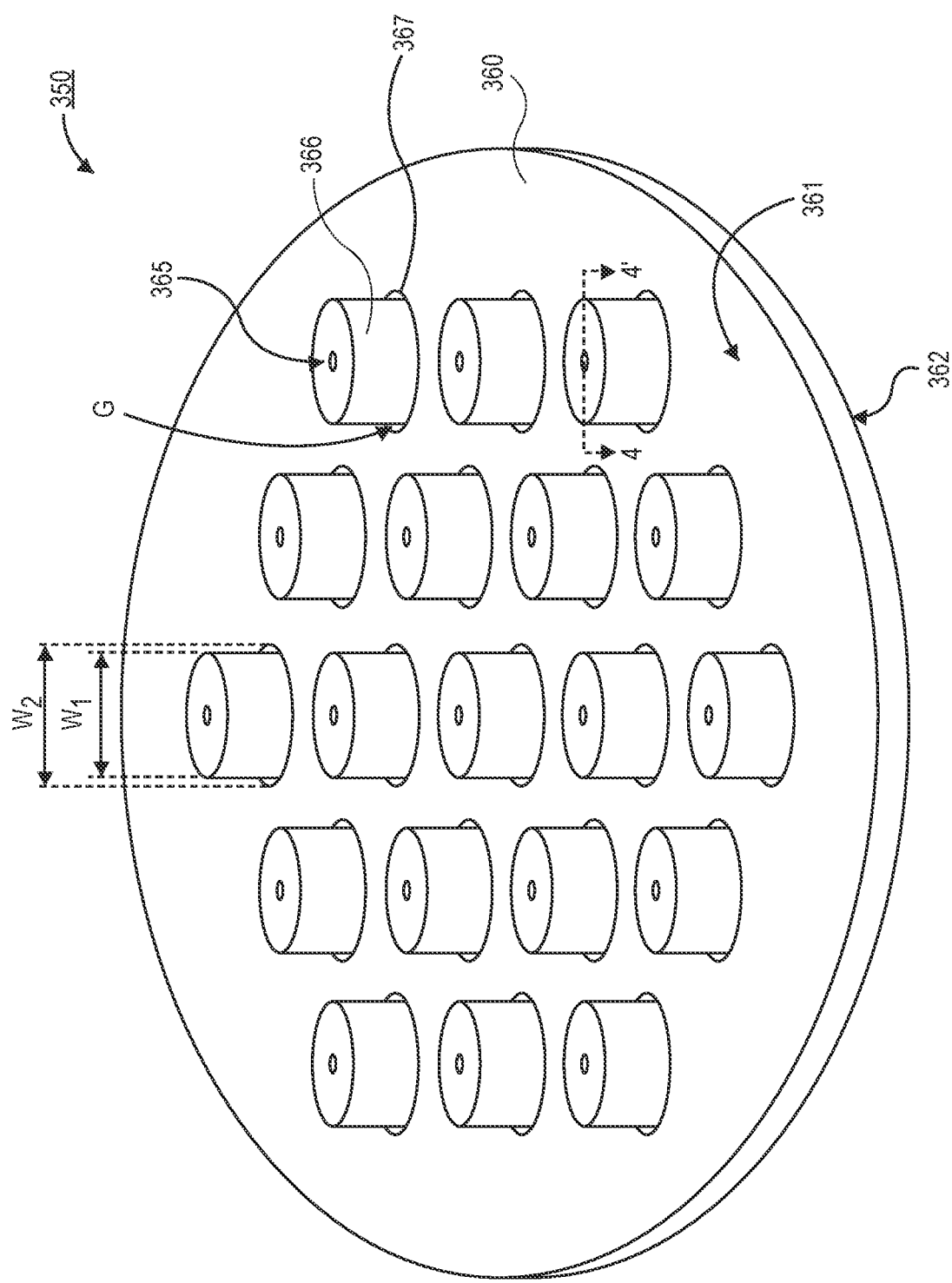
FIG. 3C is a perspective view illustration of a source array for a modular microwave plasma source, in accordance with an embodiment.

Referring now to FIG. 3C, a perspective view illustration of a source array 350 is shown, in accordance with an embodiment. In an embodiment, the source array 350 comprises a dielectric plate 360. A plurality of cavities 367 are disposed into a first surface 361 of the dielectric plate 360. The cavities 367 do not pass through to a second surface 362 of the dielectric plate 360. The source array 350 may further include a plurality of dielectric resonators 366. Each of the dielectric resonators 366 may be in a different one of the cavities 367. Each of the dielectric resonators 366 may comprise a hole 365 in the axial center of the dielectric resonator 366.

In an embodiment, the dielectric resonators 366 may have a first width $W_1$, and the cavities 367 may have a second width $W_2$. The first width $W_1$ of the dielectric resonator 366 is smaller than the second width $W_2$ of the cavities 367. The difference in the widths provides a gap G between a sidewall of the dielectric resonators 366 and a sidewall of the cavity 367. In the illustrated embodiment, each of the dielectric resonators 366 are shown as having a uniform width $W_1$. However, it is to be appreciated that not all dielectric resonators 366 of a source array 350 need to have the same dimensions.

Figure 3D:
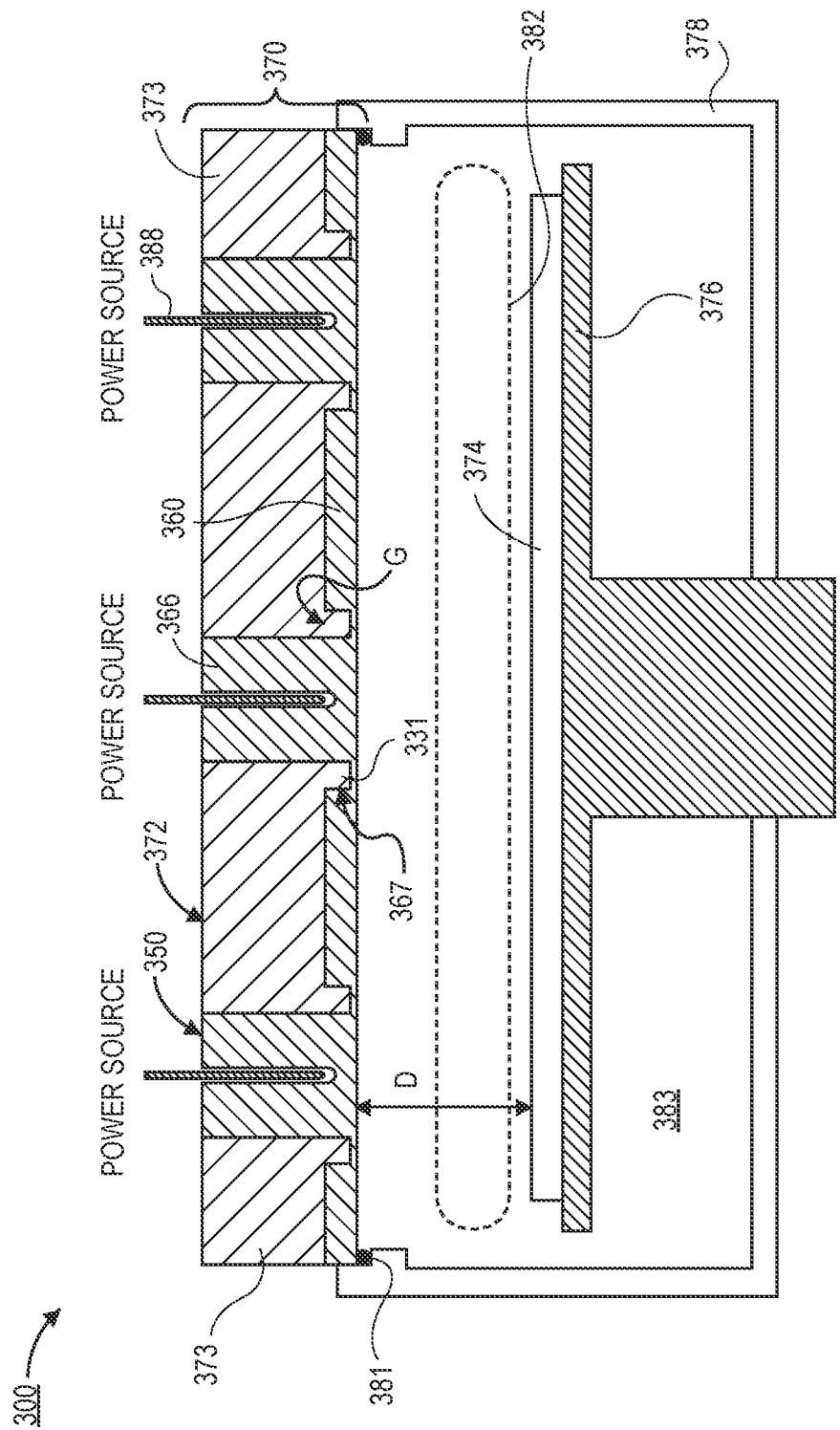
FIG. 3D is a cross-sectional illustration of a processing chamber for depositing a graphene layer, in accordance with an embodiment.

Referring now to FIG. 3D, a cross-sectional illustration of a processing tool 300 that includes an assembly 370 is shown, in accordance with an embodiment. In an embodiment, the processing tool comprises a chamber 378 that is sealed by an assembly 370. For example, the assembly 370 may rest against one or more O-rings 381 to provide a vacuum seal to an interior volume 383 of the chamber 378. In other embodiments, the assembly 370 may interface with the chamber 378. That is, the assembly 370 may be part of a lid that seals the chamber 378. In an embodiment, the processing tool 300 may comprise a plurality of processing volumes (which may be fluidically coupled together), with each processing volume having a different assembly 370. In an embodiment, a chuck 379 or the like may support a workpiece 374 (e.g., wafer, substrate, etc.). The workpiece 374 may be a distance D from the assembly 370. In an embodiment, the chamber volume 383 may be suitable for striking a plasma 382. That is, the chamber 378 may be a vacuum chamber.

In an embodiment, the assembly 370 comprises a source array 350 and a housing 372. The source array 350 may comprise a dielectric plate 360 and a plurality of dielectric resonators 366 extending up from the dielectric plate 360. Cavities 367 into the dielectric plate 360 may surround each of the dielectric resonators 366. Sidewalls of the cavity 367 are separated from the sidewall of the dielectric resonator 366 by a gap G. The dielectric plate 360 and the dielectric resonators 366 of the source array 350 may be a monolithic structure (as shown in FIG. 3D), or the dielectric plate 360 and the dielectric resonators 366 may be discrete components.

The housing 372 include rings 331 that fit into the gaps G. In an embodiment, the rings 331 and the conductive body 373 of the housing 372 are a monolithic structure (as shown in FIG. 3D), or the conductive body 373 and the rings 331 may be discrete components. The housing 372 may having openings sized to receive the dielectric resonators 366. In an embodiment, monopole antennas 388 may extend into holes in the dielectric resonators 366. The monopole antennas 388 are each electrically coupled to power sources (e.g., high-frequency emission modules 305).

Figure 4:
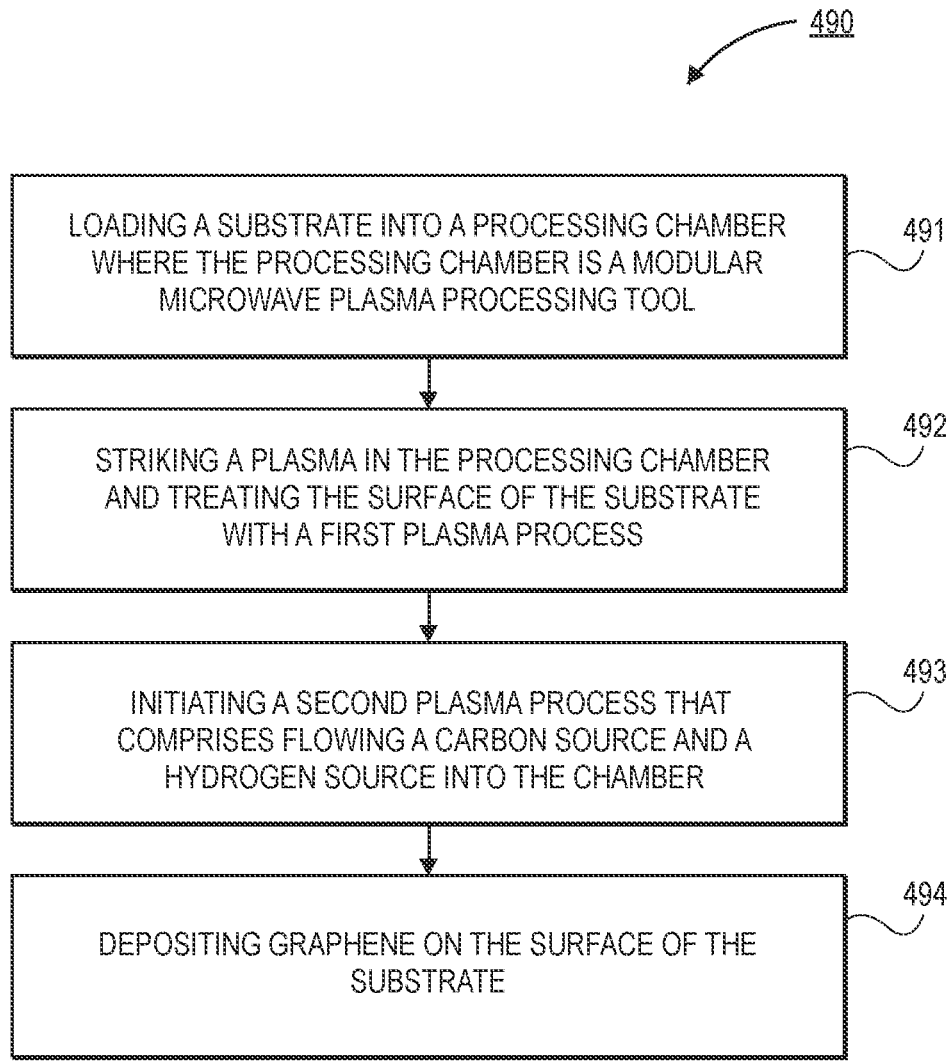
FIG. 4 is a process flow diagram of a process for depositing a graphene layer with a modular microwave plasma source, in accordance with an embodiment.

Referring now to FIG. 4, a process flow diagram of a process 490 for depositing a graphene layer on a substrate is shown, in accordance with an embodiment. In an embodiment, process 490 may begin with operation 491 which comprises loading a substrate into a processing chamber. In an embodiment, the processing chamber is a modular microwave plasma processing tool. For example, the modular microwave plasma processing tool may be similar to any of the tools described in greater detail above.

In an embodiment, the substrate may be disposed a distance D from the dielectric plate of the dielectric source array. It has been shown that reducing the distance D provides an improved graphene layer. Particularly, as the distance D is reduced low $I_D/I_G$ ratios are observed, and there is substantially no change in the $I_{2D}/I_G$ ratio. In a particular embodiment, the distance D may be approximately 8 cm or less, approximately 4 cm or less, or approximately 2 cm or less.

In an embodiment, the substrate may be any substrate onto which a graphene layer is desired to be deposited. In a particular embodiment, the substrate may comprise a semiconductor device (e.g., a semiconductor wafer). The graphene may be desired to be deposited onto a conductive surface, such as a copper surface. In an embodiment, the conductive surface may be a trace, a via, or the like. Forming a graphene layer over a conductive surface may result in a decrease in the contact resistance. In an embodiment, conductive surfaces onto which the graphene layer is deposited may include, but is not limited to, copper, cobalt, ruthenium, molybdenum, tungsten, and titanium nitride.

In an embodiment, process 490 may continue with operation 492, which comprises striking a plasma in the processing chamber and treating the surface of the substrate with a first plasma process. In an embodiment, the first plasma process may be a cleaning process in order to provide a pristine surface onto which the graphene can be deposited. For example, the first plasma process may be targeted to remove an oxide that has formed over conductive surfaces. In some embodiments, operation 492 may be optional. That is, process 490 may proceed from operation 491 directly to operation 493.

In an embodiment, process 490 may continue with operation 493, which comprises initiating a second plasma process that comprises flowing a carbon source gas and a hydrogen source gas into the chamber. In an embodiment, an inert gas, such as argon, may also be flown into the processing chamber. Due to the modular microwave configuration, the plasma may be a high density plasma with a large concentration of atomic hydrogen. As such, low temperature deposition of graphene is possible.

In an embodiment, the carbon source gas may comprise any carbon containing molecules. For example, the carbon source gas may comprise methane and/or ethylene. It has been shown, that lower flow rates of the carbon source gas provides graphene with an improved microstructure. For example, lower flow rates of the carbon source gas may include a lower $I_D/I_G$ ratio and a higher $I_{2D}/I_G$ ratio. In an embodiment, the flow rate of the carbon containing source gas may be approximately 25 sccm or less, approximately 10 sccm or less, or approximately 5 sccm or less.

In an embodiment, the pressure in the processing chamber may be characterized as a low pressure process. Particularly, it has been shown that lower pressures result in a decrease in the $I_D/I_G$ ratio and provides a more defect free graphene film. Additionally, it has been shown that decreases in pressure do not have a significant impact on the $I_{2D}/I_G$ ratio. In an embodiment, the pressure in the processing chamber may be approximately 225 mTorr or lower, approximately 125 mTorr or lower, or approximately 75 mTorr or lower.

As noted above, embodiments disclosed herein allow for low temperature graphene deposition. That is, the temperature of the substrate may be held at lower temperatures than previously disclosed graphene deposition processes. Particularly, embodiments disclosed herein allow for substrate temperatures that are approximately 400° C. or less, approximately 200° C. or less, or approximately 100° C. or less. Additionally, it is noted that in previous attempts to deposit graphene higher temperatures provided improved crystal structures. However, it has been shown that lower temperatures are actually beneficial for providing a more defect free graphene in accordance with embodiments disclosed herein. For example, the $I_D/I_G$ ratio decreases with decreasing substrate temperature, and the $I_{2D}/I_G$ ratio increases with decreasing substrate temperatures. At temperatures above approximately 400° C., the deposition process may result in the formation of a mostly amorphous carbon layer.

In an embodiment, process 490 may continue with operation 494, which comprises depositing graphene on the surface of the substrate. In an embodiment, atomic hydrogen in the plasma promotes surface mobilities to allow for surface diffusion and generation of the graphene. The graphene may be a single layer of graphene in some embodiments. In other embodiments, two or more layers of graphene sheets may be deposited over the surface of the substrate.

In an embodiment, the surface of the substrate may comprise a conductive material. For example, the conductive material may comprise copper or a copper alloy. The deposition of a graphene layer over the conductive material may allow for a reduction in the contact resistance, and allows for improved performance of the semiconductor devices on the substrate. In an embodiment, conductive surfaces onto which the graphene layer is deposited may include, but is not limited to, copper, cobalt, ruthenium, molybdenum, tungsten, and titanium nitride.

Figure 5A:
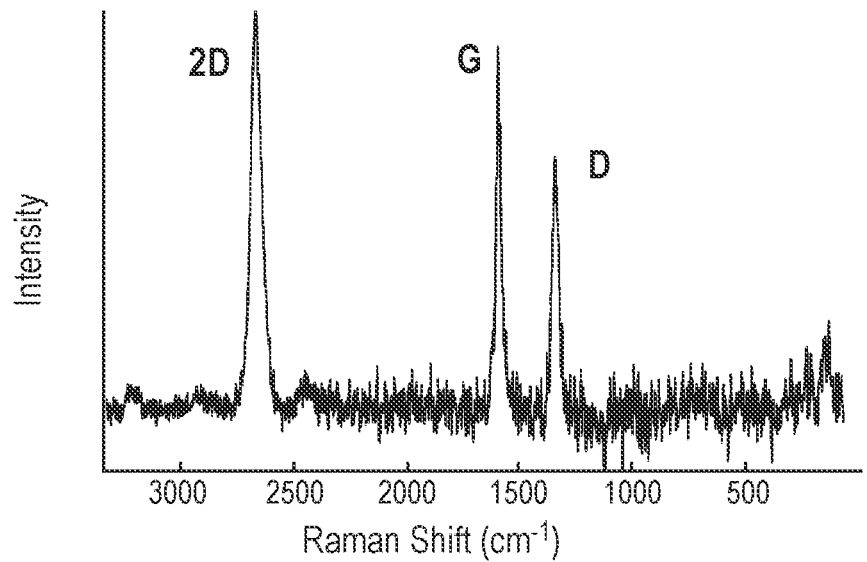
FIG. 5A is a Raman shift graph of a graphene layer formed with the process in FIG. 4, in accordance with an embodiment.

Referring now to FIG. 5A, a Raman shift plot of a graphene layer formed in accordance with process 490 is shown, in accordance with an embodiment. In an embodiment, the process 490 may have a duration of the second plasma process that is approximately 10 minutes. As shown, the intensity of the 2D peak indicates that graphene is formed. Additionally, the plot illustrates that the ratios are acceptable for quality graphene. For example, the $I_{2D}/I_G$ ratio is approximately 1.2, and the $I_D/I_G$ ratio is approximately 1.

Figure 5B:
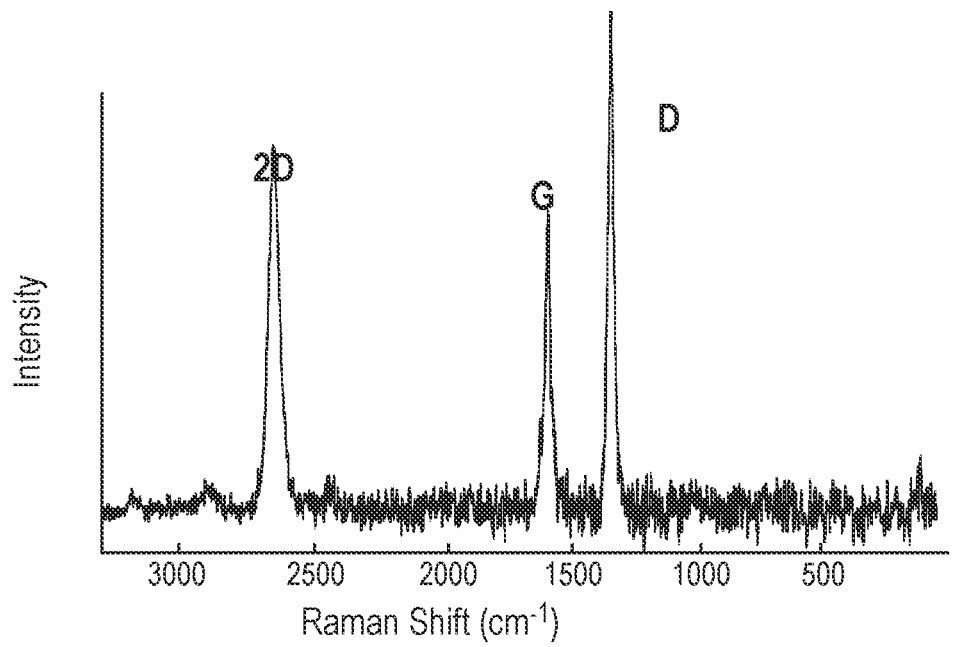
FIG. 5B is a Raman shift graph of a graphene layer formed with the process in FIG. 4, in accordance with an additional embodiment.

Referring now to FIG. 5B, a Raman shift plot of a graphene layer formed in accordance with process 490 is shown, in accordance with an additional embodiment. In an embodiment, the process 490 may have a duration of the second plasma process that is approximately 20 minutes. As shown, the intensity of the 2D peak indicates that graphene is formed. However, the D peak has also increased. The increase in the D peak may be attributable to more layers of the graphene forming during the extended duration. Despite the higher D peak, the overall quality of the graphene is still acceptable. For example, the $I_{2D}/I_G$ ratio is approximately 1.2, and the $I_D/I_G$ ratio is approximately 1.7.

It is to be appreciated that the formation of the graphene layer may have a relatively long incubation time. For example, at a duration of the second plasma process of approximately 5 minutes, there may be no defined peak at D2 to indicate the formation of graphene.

Figure 6:
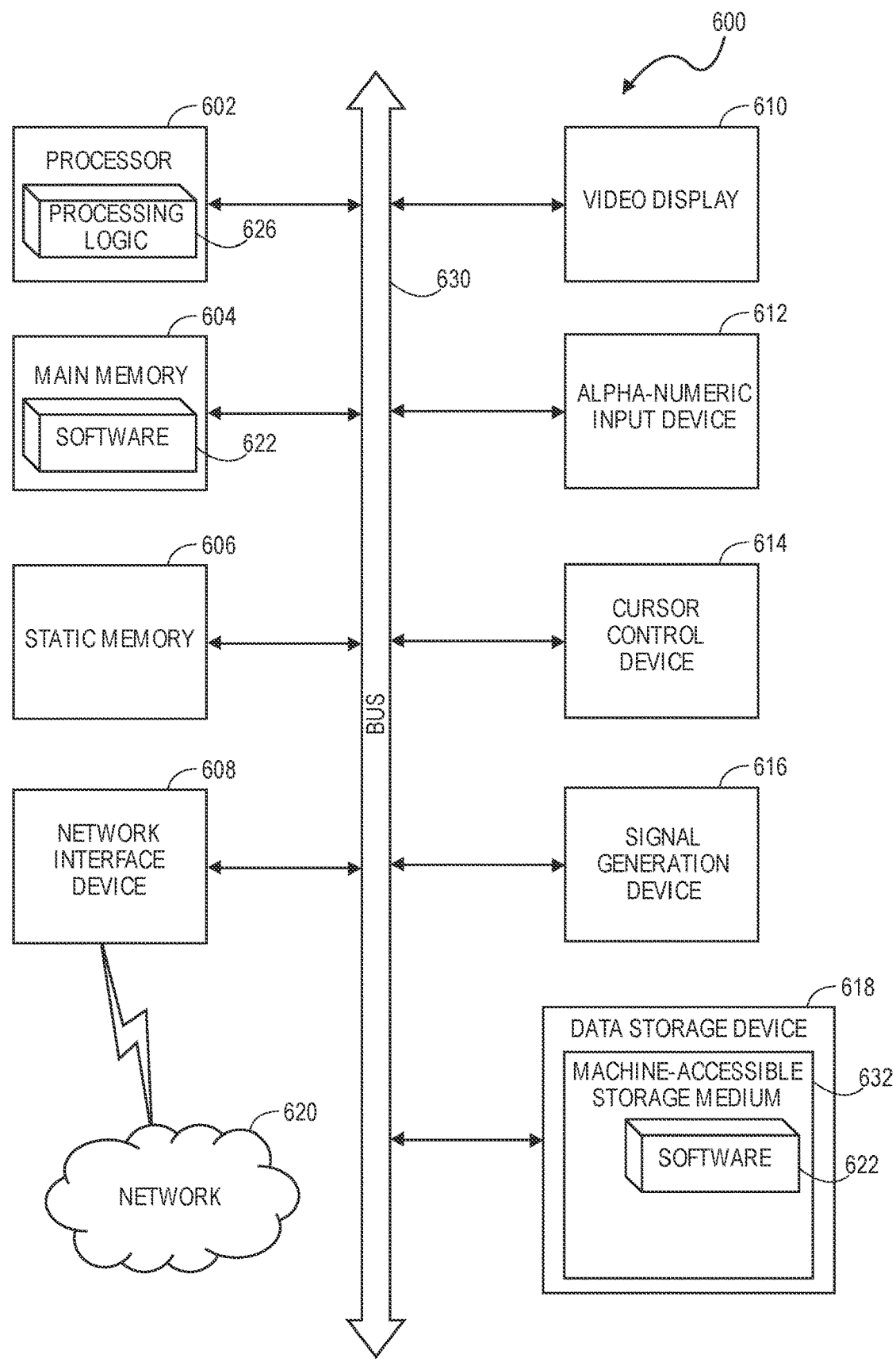
FIG. 6 illustrates a block diagram of an exemplary computer system that may be used in conjunction with a high-frequency plasma tool, in accordance with an embodiment.

Referring now to FIG. 6, a block diagram of an exemplary computer system 600 of a processing tool is illustrated in accordance with an embodiment. In an embodiment, computer system 600 is coupled to and controls processing in the processing tool. Computer system 600 may be connected (e.g., networked) to other machines in a Local Area Network (LAN), an intranet, an extranet, or the Internet. Computer system 600 may operate in the capacity of a server or a client machine in a client-server network environment, or as a peer machine in a peer-to-peer (or distributed) network environment. Computer system 600 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 600, the term "machine" shall also be taken to include any collection of machines (e.g., computers) that individually or jointly execute a set (or multiple sets) of instructions to perform any one or more of the methodologies described herein.

Computer system 600 may include a computer program product, or software 622, having a non-transitory machine-readable medium having stored thereon instructions, which may be used to program computer system 600 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 600 includes a system processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a secondary memory 618 (e.g., a data storage device), which communicate with each other via a bus 630.

System processor 602 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 602 may also be one or more special-purpose processing devices such as an application specific integrated circuit (ASIC), a field programmable gate array (FPGA), a digital signal system processor (DSP), network system processor, or the like. System processor 602 is configured to execute the processing logic 626 for performing the operations described herein.

The computer system 600 may further include a system network interface device 608 for communicating with other devices or machines. The computer system 600 may also include a video display unit 610 (e.g., a liquid crystal display (LCD), a light emitting diode display (LED), or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium 632 (or more specifically a computer-readable storage medium) on which is stored one or more sets of instructions (e.g., software 622) embodying any one or more of the methodologies or functions described herein. The software 622 may also reside, completely or at least partially, within the main memory 604 and/or within the system processor 602 during execution thereof by the computer system 600, the main memory 604 and the system processor 602 also constituting machine-readable storage media. The software 622 may further be transmitted or received over a network 620 via the system network interface device 608. In an embodiment, the network interface device 608 may operate using RF coupling, optical coupling, acoustic coupling, or inductive coupling.

While the machine-accessible storage medium 632 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A method of depositing a graphene layer on a substrate, comprising:

providing a substrate within a modular microwave plasma chamber, the substrate comprising a titanium nitride surface;

pretreating the substrate with a plasma treatment in the modular microwave plasma chamber to remove an oxide from the titanium nitride surface of the substrate;

subsequent to pretreating the substrate, without removing the substrate from the modular microwave plasma chamber, flowing a carbon source and a hydrogen source into the modular microwave plasma chamber;

subsequent to flowing the carbon source and the hydrogen source, without removing the substrate from the modular microwave plasma chamber, striking a plasma in the modular microwave plasma chamber, wherein a substrate temperature is below approximately 400° C.; and subsequent to striking the plasma, without removing the substrate from the modular microwave plasma chamber, depositing the graphene layer on the titanium nitride surface of the substrate in the modular microwave plasma chamber.

2. The method of claim 1, wherein the graphene layer is substantially a single sheet of graphene.

3. The method of claim 1, wherein the graphene layer comprises a plurality of sheets of graphene stacked over each other.

4. The method of claim 1, wherein the substrate temperature is below approximately 100° C.

5. The method of claim 1, wherein a laser Raman spectrum of the graphene layer comprises an $I_D/I_G$ ratio that is approximately 1.0 or smaller.

6. The method of claim 1, wherein a laser Raman spectrum of the graphene layer comprises an $I_{2D}/I_G$ ratio that is approximately 1.0 or greater.

7. The method of claim 1, further comprising:
flowing an inert gas into the modular microwave chamber during the flowing of the carbon source and the hydrogen source into the modular microwave plasma chamber.

8. The method of claim 1, wherein a surface of the substrate is approximately 4 cm or less from a surface of the source of the modular microwave plasma chamber.

9. A method of depositing a graphene layer on a substrate, comprising:
providing a substrate in a modular microwave plasma chamber, wherein the modular microwave plasma chamber comprises:
a chamber;
a dielectric chamber lid;
a plurality of microwave applicators coupled to the dielectric chamber lid, wherein the plurality of microwave applicators sit in recesses into the dielectric chamber lid; and
a plurality of solid state microwave emission modules, wherein each solid state microwave emission module is coupled to one of the plurality of microwave applicators;
pretreating the substrate with a plasma treatment in the modular microwave plasma chamber to remove an oxide from a titanium nitride surface of the substrate;
subsequent to pretreating the substrate, without removing the substrate from the modular microwave plasma chamber, flowing a carbon source and a hydrogen source into the modular microwave plasma chamber;

subsequent to flowing the carbon source and the hydrogen source, without removing the substrate from the modular microwave plasma chamber, striking a plasma in the modular microwave plasma chamber by applying microwave power to a plurality of antennae that are laterally separated from each other, wherein a substrate temperature is below approximately 400° C.; and subsequent to striking the plasma, without removing the substrate from the modular microwave plasma chamber, depositing the graphene layer on the titanium nitride surface of the substrate in the modular microwave plasma chamber.

10. The method of claim 9, wherein a diameter of the recesses is greater than a diameter of the microwave applicators.

11. The method of claim 10, wherein dielectric bodies of the microwave applicators are a monolithic part with the dielectric chamber lid.

12. The method of claim 9, wherein the substrate temperature is below approximately 100° C.

13. The method of claim 9, wherein a distance between the dielectric chamber lid and the substrate is approximately 4 cm or less.

14. A method of depositing a graphene layer on a substrate, comprising:
providing a substrate within a modular microwave plasma chamber, the substrate comprising a titanium nitride surface;
treating a surface of the substrate with a first plasma process in the modular microwave plasma chamber to remove an oxide from the titanium nitride surface of the substrate;
subsequent to treating the surface of the substrate, without removing the substrate from the modular microwave plasma chamber, initiating a second plasma process that comprises flowing a carbon source and a hydrogen source into the modular microwave plasma chamber, and subsequent to flowing the carbon source and the hydrogen source, without removing the substrate from the modular microwave plasma chamber, striking a plasma in the modular microwave plasma chamber, wherein a substrate temperature is below approximately 400° C.; and
subsequent to striking the plasma, without removing the substrate from the modular microwave plasma chamber, depositing the graphene layer on the titanium nitride surface of the substrate in the modular microwave plasma chamber, wherein a laser Raman spectrum of the graphene layer comprises an $I_D/I_G$ ratio that is approximately 1.0 or smaller, and wherein the laser Raman spectrum of the graphene layer comprises an $I_{2D}/I_G$ ratio that is approximately 1.0 or greater.

15. The method of claim 14, wherein the substrate temperature is below approximately 100° C.

* * * * *